United States Patent [19]

Burn

[11] Patent Number: 4,794,552

[45] Date of Patent: Dec. 27, 1988

[54] SIGNAL SYNTHESIZER

[75] Inventor: Colin Burn, Whitley Bay, England

[73] Assignee: National Nuclear Corporation Limited, Knutsford, England

[21] Appl. No.: 793,263

[22] Filed: Oct. 31, 1985

[30] Foreign Application Priority Data

Nov. 7, 1984 [GB] United Kingdom ............... 8428182
Feb. 21, 1985 [GB] United Kingdom ............... 8504512

[51] Int. Cl.⁴ .................. G01C 25/00; G06F 15/20; G06G 7/16
[52] U.S. Cl. .............................. 364/571.01; 307/491; 364/607; 364/851; 364/480
[58] Field of Search ............... 364/480, 481, 487, 571, 364/574, 607, 851; 328/14, 135, 185; 307/491; 371/27; 367/13

[56] References Cited

U.S. PATENT DOCUMENTS

| | | | |
|---|---|---|---|
| 4,099,240 | 7/1978 | Rode et al. | 364/607 X |
| 4,204,261 | 5/1980 | Ruszala et al. | 364/551 X |
| 4,316,259 | 2/1982 | Albrecht et al. | 371/27 X |
| 4,355,367 | 10/1982 | Masuzawa et al. | 364/574 X |
| 4,373,394 | 2/1983 | Renzel et al. | 328/185 X |
| 4,391,124 | 7/1983 | Drost et al. | 364/571 X |
| 4,438,466 | 3/1984 | Fawkes et al. | 328/185 X |
| 4,581,585 | 4/1986 | Bristol | 328/185 |

Primary Examiner—Gary Chin
Assistant Examiner—Joseph L. Dixon
Attorney, Agent, or Firm—William R. Hinds

[57] ABSTRACT

A signal synthesizer is provided for producing pulses simulating characteristics of echo pulses generated during ultrasonic scanning so that the simulated pulses can be used in the calibration of equipment for processing the outputs of ultrasonic transducers. The synthesizer produces an envelope signal of selectively variable amplitude and rise and fall time and multiplies this envelope respectively with a high frequency pulse train and a substantially zero amplitude signal in a dual matched multiplier so that the subtractively combined outputs of the multiplier are free of unwanted feedthrough components introduced by the mulitplier.

4 Claims, 3 Drawing Sheets

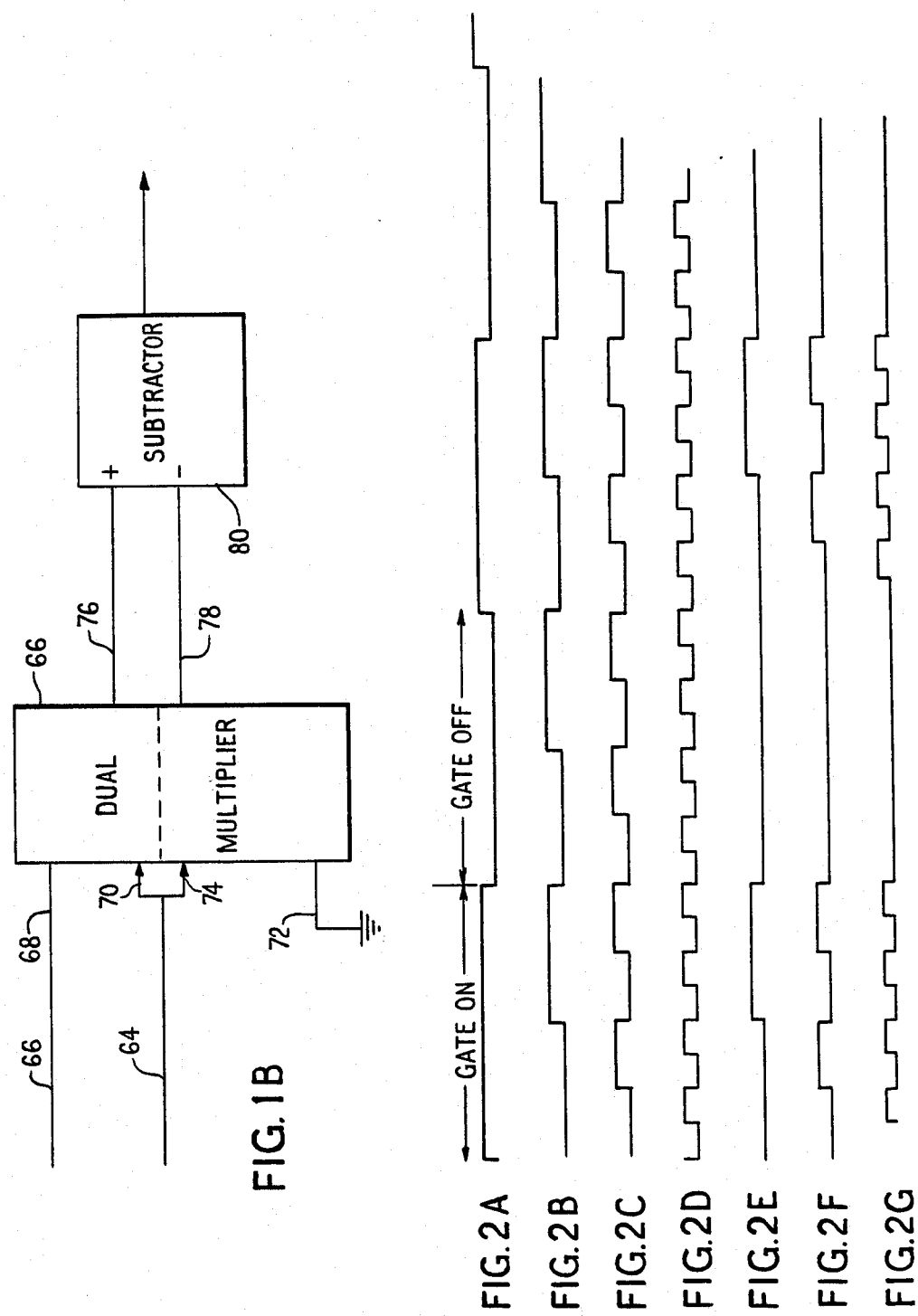

SIGNAL SYNTHESIZER

BACKGROUND OF THE INVENTION

This invention relates to a signal synthesizer for producing pulses simulating the characteristics of echo pulses generated during ultrasonic scanning techniques. Such pulses can then be used for calibration of equipment for processing the outputs of ultrasonic transducers.

FEATURES AND ASPECTS OF THE INVENTION

According to the present invention there is provided a signal synthesizer comprising means for generating a high frequency pulse train, means for producing an envelope having a rising edge, a falling edge and a plateau between those edges, means for selectively varying the rise and fall times of said edges of the envelope, means for varying the duration of the envelope, means for multiplying said envelope with, on the one hand, said high frequency pulse train and with, on the other hand, a substantially zero amplitude signal to provide two outputs having superimposed feedthrough components introduced by the multiplying means, and means for combining the output signals to derive a calibration signal substantially free of said feedthrough components.

Preferably means is provided for effecting phase shift of said pulse train with respect to the envelope.

The multiplying means employed in the present invention may be a dual matched multiplier such as the AD539 device manufactured by Analogue Devices. By using the device as indicated above, it is possible to achieve accurate multiplication involving high frequency signals while freeing the calibration signal from feedthrough components without any filtering.

Means may be provided for varying the amplitude of the calibration signal, for example by means of a switched attenuator connected to the output of the combining means.

The combining means may be a differential amplifier for effecting subtraction of one multiplied output from the other.

BRIEF DESCRIPTION OF THE DRAWINGS

The invention will now be described by way of example only with reference to the accompanying drawings, in which:

FIGS. 1A and 1B together form a schematic block circuit diagram; and

FIGS. 2A to 2M illustrate the nature of the signals prevailing at certain points in the circuit.

DESCRIPTION OF PREFERRED EMBODIMENT

Figure 1A:
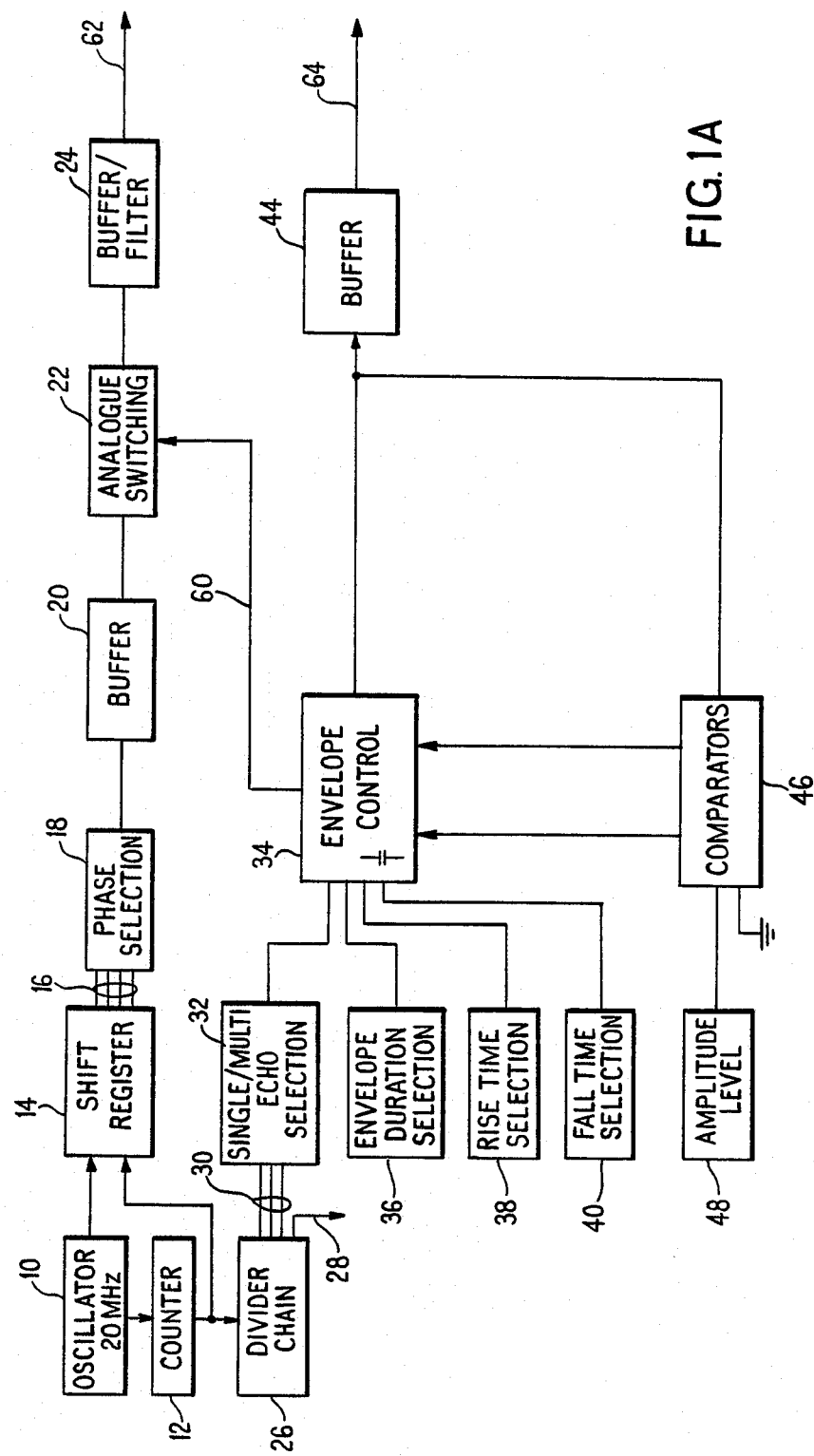

Referring to FIGS. 1A and 1B, a fixed frequency 20 MHz oscillator 10 is connected to a counter 12 which, in conjunction with a shift register 14, serves to produce four 5 MHz outputs 16 which are phase shifted by 90° with respect to one another. Any one of the outputs 16 may be selected by phase selection circuitry 18, eg. manually operable switches located on a control console, and coupled to a dual multiplier (see FIG. 1B) via buffer amplifier 20, analogue switching circuitry 22 (eg. FET switches) and buffer/low pass filter section 24 which blocks frequencies exceeding 5 MHz.

The output of the counter 12 is connected to a divider chain 26 which provides a gating pulse on line 28 which may define a gating period and three pulse trains on lines 30, the pulse trains being different subdivisions of the gating pulse, eg. so that there are 1, 2 or 4 pulses respectively within the gating interval (see the waveforms of FIGS. 2A, B, C and D). FIG. 2A represents the gating pulses and it will be noted that the other three waveforms are sub-multiples of this. The pulse trains on lines 30 govern whether the calibration signals produced will simulate a single echo or a multiple echo response, ie. 1, 2 or 4 echoes in the example illustrated.

Selection of a single or multiple echo simulation is effected by means of circuitry 32 which may comprise a number of manually operable switches for routing the signal on a selected one of the lines 30 to circuitry 34 for controlling generation of the envelope of the simulated pulses. FIGS. 2E, 2F and 2G illustrate the waveforms that may be applied to the circuit 34, according to the selection made. The control circuitry 34 also receives inputs from circuits 36, 38 and 40 which determines other parameters of the pulse envelope, namely envelope duration (circuit 36), pulse rise time (circuit 38) and pulse fall time (circuit 40). The circuits 36, 38 and 40 each include manually settable switching means for effecting adjustment of the respective parameters.

In the illustrated embodiment, the circuit 32 may also be used for controlling the relative timing of the simultated echo pulses in relation to the leading edge of the gating pulses, ie. so as to simulate echos returned from targets at different positions. In this context, it will be seen that the leading edges of the pulse trains on lines 30 (see FIGS. 2B and 2D) subdivide the gating pulse (FIG. 2A) into one, two or four and consequently the leading edges of the echo pulser provide seven timing increments with respect to the leading edges of the gating pulses. In a modification however, the pulse timing facility may be divorced from the single/multi echo selection circuit 32.

The envelope control circuit 34 includes a capacitor charging and discharging of which governs the rise and fall times of the envelope. The circuits 38, 40 may include a number of resistors (or resistor combinations) which can be selectively coupled to the capacitor to vary the CR time constant of charge or discharge and thereby adjust the rise and fall time of the envelope. The circuit 36 serves to produce a timing pulse whose duration determines the duration of the plateau of the envelope, as will be explained further below.

The output side of the capacitor is connected to the dual multiplier (FIG. 1B) via buffer section 44, operation of the analogue switching section 22 being controlled by the envelope control section so that the switches are closed only for the duration of the envelope. The envelope signal produced at the output of circuit 34 is coupled to a comparator section 46 which is also coupled to a potentiometer. The circuit 48 enables the amplitude of the envelope to be set to a selected fixed value.

In operation, when the generation of the envelope is initiated by a pulse from selection circuit 32, charging of the capacitor commences and follows the usual exponential curve, the time constant being determined by means of circuit 38. Thus, the output of the circuit 34 follows the voltage level of the capacitor and this, in turn, is compared by circuit 46 with the predetermined amplitude set by the potentiometer. When the capacitor voltage level reaches this preset value, the capacitor is open circuited to prevent further charging and a pulse from circuit 36 is then generated to maintain this condition for the required length of time during which time the output of the circuit 34 will remain substantially constant at the amplitude value preset by means of circuit 48. When this time duration is completed, in response to the trailing edge of the pulse applied by circuit 36, the capacitor is coupled to a selected resistor or resistor combination associated with circuit 40 so that the capacitor proceeds to discharge with a preset time constant. The falling voltage level is compared by circuit 46 with a zero reference level and when the latter level is reached, the comparator section 46 produces an output to reset the envelope control circuit in preparation for the next cycle of envelope generation.

Figure 2H:
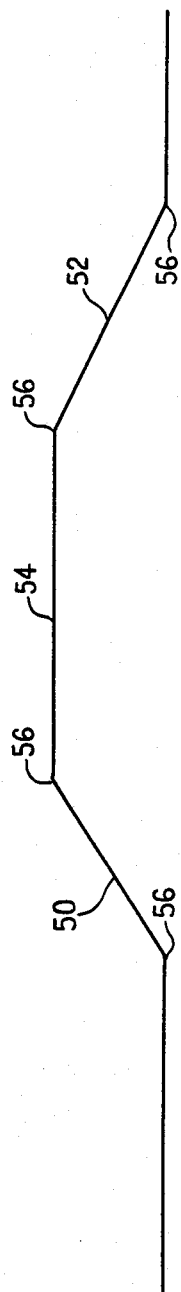
Figure 2I:

The envelope generated and supplied to the multiplier must not go negative. This is ensured by buffer 44. As shown in FIG. 2H, the envelope will be seen to comprise a rising edge 50, a falling edge 52 and a constant amplitude plateau 54. Although the rising and falling edges are of an exponential nature, they may be substantially linear if only a minor part of the exponential curves associated with the capacitor (and resistor combination) are utilized. The transition points 56 will in general be of a discontinuous nature and are therefore potential sources of high frequency components during subsequent handling by the multiplier. FIG. 2M illustrates the wave form of the 5 MHz signal and it will be understood that this will be confined to a time interval corresponding to the duration of the envelope, ie. by virtue of a control signal applied to the switching section via line 60. This is indicated by the waveform as depicted at 2I which illustrates the envelope of the 5 MHz signal without showing the fine detail of the high frequency signal.

Referring now to FIG. 1B, the signals on lines 62, 64 are applied to the dual matched multiplier 66 which is constituted by the circuit component AD539 manufactured by Analogue Devices. This device has two sets of multiplier inputs, ie. 68, 70 and 72, 74 and outputs 76, 78. The outputs 76, 78 provide the products of the signals applied to the inputs 68, 70 and to the inputs 72, 74 respectively. A feature of the AD539 device is that it is capable of accurately multiplying signals of up to 60 MHz with signals of up to 5 MHz. As shown, the inputs 68 and 72 serve to handle signals up to 60 MHz while inputs 70 and 74 handle signals of up to 5 MHz. In the illustrated embodiment, the envelope signals are applied to inputs 70 and 74, the 5 MHz carrier signal is applied to the input 68 and the input 72 is connected to the ground plane.

As previously mentioned, the envelope (FIG. 2H) includes discontinuities 56 which can give rise to significant and undesirable high frequency feedthrough components during multiplication. This is offset to some extent by the fact that the inputs 70 and 74 can handle signals up to 5 MHz—nevertheless such undesirable feedthrough components can occur even with the AD539 device. Advantage is therefore taken of the fact that this device is a dual matched multiplier by performing two multiplications, ie. the desired multiplication and a multiplication of the envelope with a zero level signal. The latter multiplication will also suffer from feedthrough and can therefore be used to compensate the desired product signal by subtraction in circuit 80, eg. a differential amplifier. This is illustrated by the waveform of FIGS. 2J and 2L.

Figure 2J:
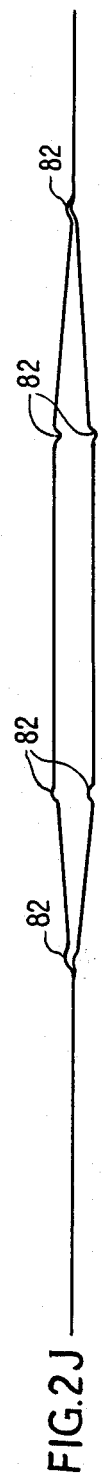
Figure 2K:
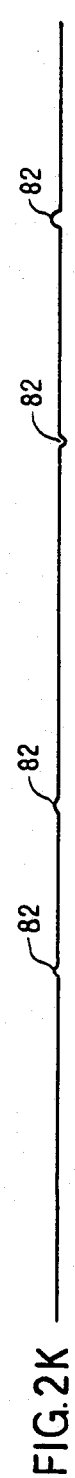
Figure 2L:
Figure 2M:

FIG. 2J represents the product signal at output 76 from which it will be seen that unwanted feedthrough components 82 are present. Likewise in the case of the product signal at output 78—see FIG. 2K. After subtraction however, the resulting output is substantially freed of the feedthrough components—see FIG. 2L. It will be understood that the waveform of FIG. 2L will be used as an echo simulating calibration pulse and that various parameters thereof can be readily varied, eg. pulse duration, rise time, fall time and timing relative to the gating pulses. In addition, the phase relationship between the envelope and the carrier may be varied.

I claim:

1. A signal synthesizer comprising: means for generating a high frequency pulse train; means for producing an envelope having a rising edge, a falling edge and a plateau between those edges, said envelope-producing means including means for selectively varying the rise and fall times of said edges of the envelope and means for varying the duration of the envelope; means for multiplying said envelope separately with said high frequency pulse train and multiplying said envelope separately with a substantially zero amplitude signal to provide two outputs having superimposed feedthrough components introduced by the multiplying means; and means for combining the output signals to derive a calibration signal substantially free of said feedthrough components.

2. A signal synthesizer as claimed in claim 1 in which means is provided for effecting phase shift of said pulse train with respect to the envelope.

3. A signal synthesizer as claimed in claim 1 including means for varying the amplitude of the calibration signal.

4. A signal synthesizer as claimed in claim 1 in which the combining means is a differential amplifier for effecting subtraction of one multiplied output from the other multiplied output.

* * * * *